US006535152B2

(12) United States Patent
Lee

(10) Patent No.: US 6,535,152 B2

(45) Date of Patent: Mar. 18, 2003

(54) ANALOG-TO-DIGITAL CONVERTER HAVING GAMMA-CORRECTED REFERENCE VOLTAGES

(75) Inventor: Bum-Ha Lee, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/034,743

(22) Filed: Dec. 28, 2001

(65) Prior Publication Data

US 2002/0109619 A1 Aug. 15, 2002

(51) Int. Cl.[7] .................................................. H03M 1/06

(52) U.S. Cl. ....................... 341/118; 341/113; 341/120; 341/138; 341/156; 341/155

(58) Field of Search ................................ 341/138, 156, 341/118, 120, 113; 348/572

(56) References Cited

U.S. PATENT DOCUMENTS 4,481,597 A * 11/1984 Robbins ..................... 341/118
5,343,201 A * 8/1994 Takayama et al. .......... 341/139
5,461,425 A 10/1995 Fowler et al.
5,691,821 A * 11/1997 Hieda et al. ................ 341/120
5,708,482 A 1/1998 Takahashi et al.
5,748,129 A * 5/1998 Tsumura ..................... 341/120
5,812,706 A 9/1998 Bertrand et al.
5,877,715 A 3/1999 Gowda et al.
6,094,153 A 7/2000 Rumsey et al.
6,115,066 A 9/2000 Gowda et al.
6,166,367 A 12/2000 Cho
6,184,721 B1 2/2001 Krymski
6,188,056 B1 2/2001 Kalnitsky et al.
6,275,259 B1 8/2001 Gowda et al.
6,437,716 B2 * 8/2002 Nakao ........................ 341/118
6,445,317 B2 * 9/2002 Lundin et al. ............. 341/118

FOREIGN PATENT DOCUMENTS

EP 0654908 A1 5/1995
JP 1-094725 4/1989
JP 4-335767 11/1992
JP 5-064225 3/1993
JP 5-300425 11/1993
JP 11-085975 3/1999

OTHER PUBLICATIONS

UK Seach Report dated Sep. 18, 2002 (2 pages).

* cited by examiner

*Primary Examiner*—Michael Tokar
*Assistant Examiner*—Lam T. Mai
(74) *Attorney, Agent, or Firm*—Marshall, Gerstein & Borun

(57) ABSTRACT

An analog-to-digital converter with a gamma correction function includes a gamma correction unit for generating a plurality of reference voltages corrected according to a gamma function and a decoding unit for selecting at least one corrected reference voltage in response to an input signal and performing analog-to-digital conversion of the selected reference voltage.

9 Claims, 5 Drawing Sheets

PAD_1 VrefT Node1 R1 S1 VDD VSS S2 R2 Node2 PAD_1 VrefB IN 110 100 120 R11 R12 group_1 R1m R1n S11 S1l S1m S1n N1 Vc1 R21 R22 group_2 R2m R2n S21 S2a S2b S2c Vc2 N2 R31 R32 group_3 R3m R3n S31 S3l S3m S3n Vcn Nn Rn1 Rn2 group_n Rnm Rnn Sn1 Snl Snm Snn 200 210 211 212 211_1 211_2 211_n COARSE DECODER n UPPER BIT 220 SWITCH CONTROL UNIT 231_1 231_l 231_m 231_n 231 232 230 FINE DECODER n LOWER BIT

ANALOG-TO-DIGITAL CONVERTER HAVING GAMMA-CORRECTED REFERENCE VOLTAGES

BACKGROUND

1. Technical Field

The present invention relates generally to an analog-to-digital converter for converting various image signals to digital signals and, more particularly, to an analog-to-digital converter that prevents signal distortion during gamma correction and which-simplifies digital image processing.

2. Description of Related Technology

When analog image input signals are expressed on a display apparatus, such as a CRT monitor, original colors may be distorted because the display apparatus typically has a non-linear response characteristic to input signals. Such a non-linear response characteristic is shown as a dashed line in FIG. 1.

To correct distortion and display the original image input signal, a gamma correction is typically performed. A gamma correction corrects a distorted image signal by using a gamma function, which is depicted as a solid line in FIG. 1. Gamma correction is an important image processing operation because the image quality of the display apparatus may be dependent on how the gamma correction is applied. Because conventional gamma correction is carried out after analog-to-digital conversion of the original input signal, distortion of the original signal during analog-to-digital conversion may render any subsequent gamma correction ineffective.

FIG. 2 is a block diagram that depicts one known image signal processing technique. As shown in FIG. 2, a conventional gamma correction technique includes the steps of converting input image signals (analog image signals) to digital signals by using an analog-to-digital converter at block 20, applying gamma correction to the digital signals at block 21 and performing image signal processing and sending the image signals to a display apparatus after gamma correction at block 22.

In the analog-to-digital conversion of the image input signals, when the input analog image signals do not exactly match with the digital signals because of the nonlinear characteristic of the analog signals, the mapping of the analog signals to the digital signals is performed using approximate digital values. One result of such an approximate mapping procedure is that the video input signals may be randomly distorted. Such random distortion is particularly problematic in the case of low level input signals.

Because conventional gamma correction is performed on a randomly distorted signal, an exact gamma function cannot be applied to the input signals. .Additionally, another digital processing block is required to perform the gamma correction after the analog-to-digital conversion of the input signals. In additional digital processing, because the digital processing converts a non-continuous input signal to non-continuous output signal by using a non-linear function, it is very difficult to implement the digital processing block of the gamma correction with simple multipliers. As a result, a larger chip, which consumes more power, is typically required to implement the digital processing block.

FIG. 3 is a block diagram illustrating another known image signal processing technique. As shown in FIG. 3, analog input signals are corrected at block 30 and the corrected analog input signals are converted into digital signals according to linear reference voltage at block 40 and then digital codes are output. To carry out this analog-to-digital conversion technique, an additional circuit is needed to cause the time-dependant input signals to have an exact transfer function. However, it is very difficult to implement such an additional circuit because of a distortion difference between levels of the input signals, a distortion of the transfer function according to frequency characteristic of the input signals and a transfer characteristic according to the input level of the analog signals.

SUMMARY OF THE INVENTION

In accordance with one aspect an analog-to-digital converter may include a gamma correction unit for generating a plurality of reference voltages corrected according to a gamma function and a decoding unit for selecting at least one corrected reference voltage in response to an input signal and performing analog-to-digital conversion of the selected reference voltage.

DETAILED DESCRIPTION OF THE INVENTION

Figure 1:
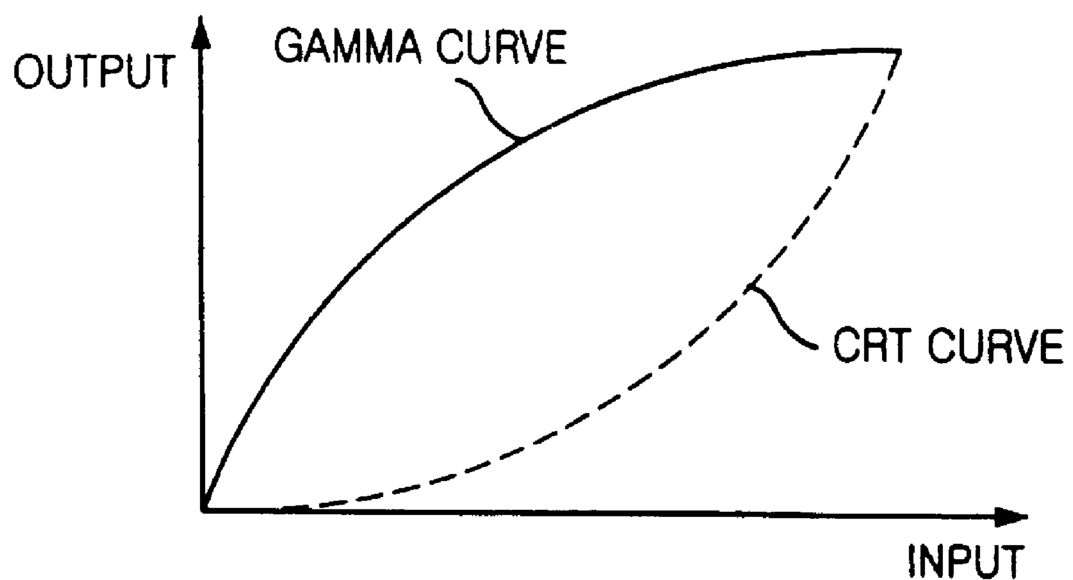
FIG. 1 is an exemplary graph that depicts a gamma curve.
Figure 2:
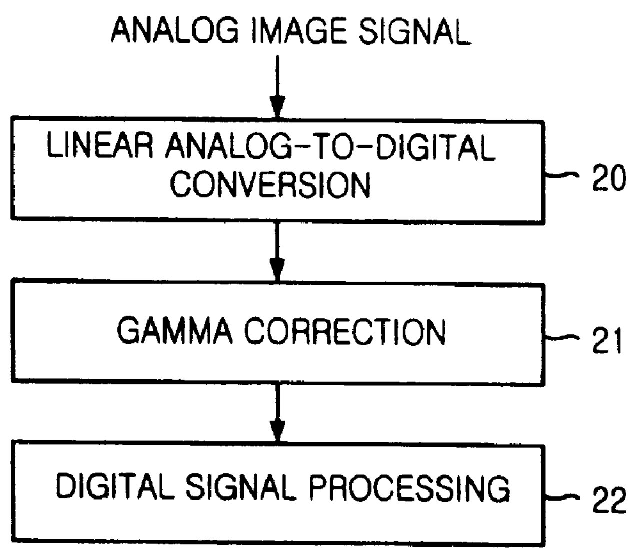
FIG. 2 is an exemplary block diagram that depicts one known image signal processing technique.
Figure 3:
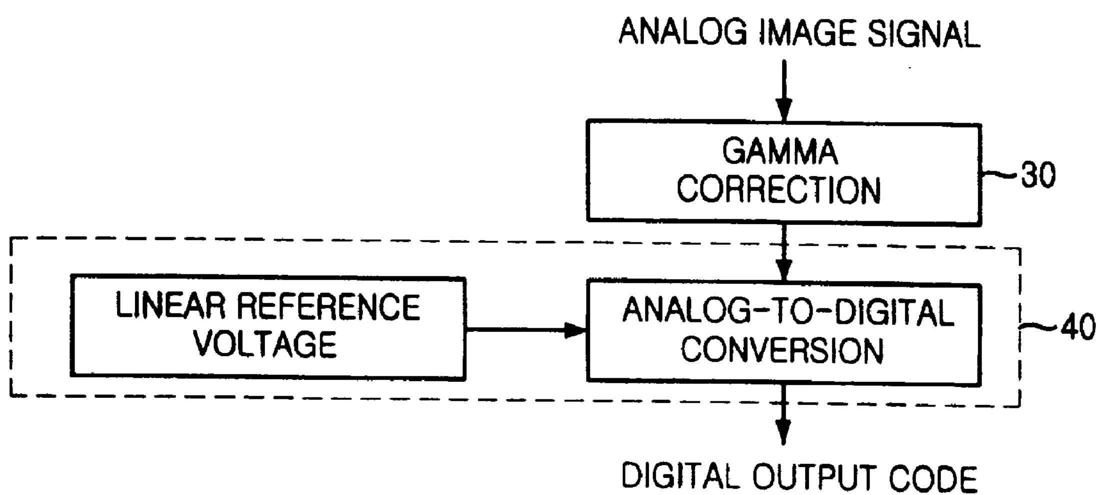
FIG. 3 is an exemplary block diagram that depicts another known image signal processing technique.
Figure 4:
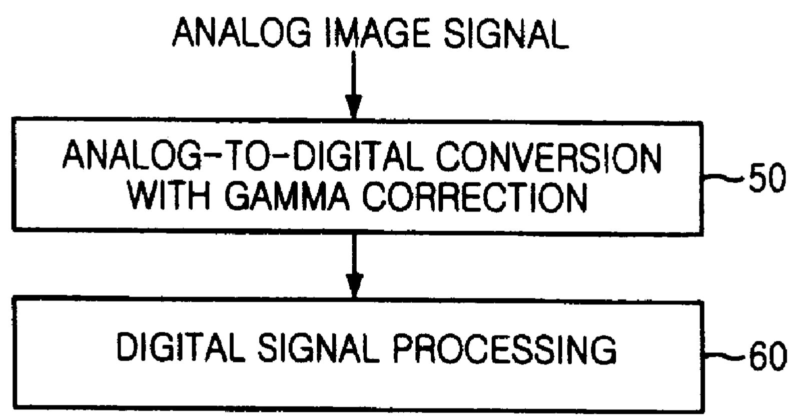
FIG. 4 is an exemplary block diagram that depicts an image signal processing system and technique that uses a plurality of reference voltages to reduce signal distortion during gamma correction.

FIG. 4 is an exemplary block diagram that depicts an image signal processing system and technique that uses a plurality of reference voltages to reduce signal distortion during gamma correction. As shown in FIG. 4, analog input signals are converted into digital signals by the analog-to-digital converter, which has a gamma correction function, at block 50 and digital signal processing is performed at block 60.

Figure 5:
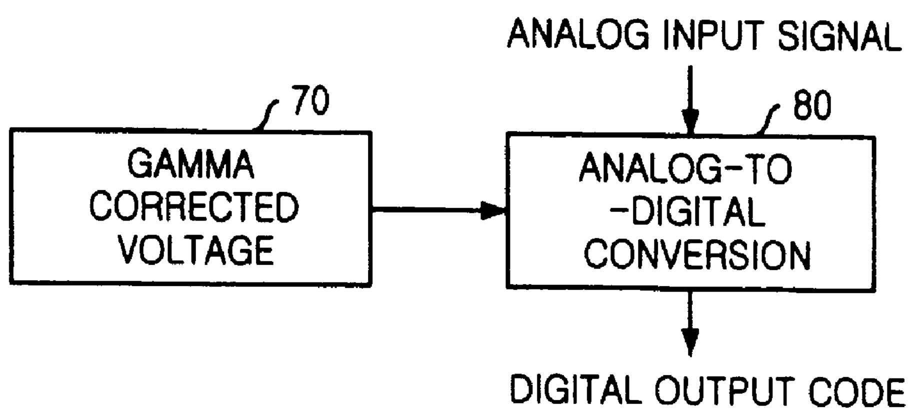
FIG. 5 is a detailed block diagram of part of the system and technique shown in FIGS. 4 and 5.

FIG. 5 is a detailed block diagram of part of the system and technique shown in FIG. 4. As shown in FIG. 5, because it is impossible to correct analog input signals using a gamma function in real time, independent of the frequency and amplitude of the input signals, the analog-to-digital converter having a gamma correction function includes a first block 70 that generates a reference voltage corrected by the gamma function and a second block 80 for analog-to-digital conversion of the correction voltage selected by analog input signals.

Figure 6:
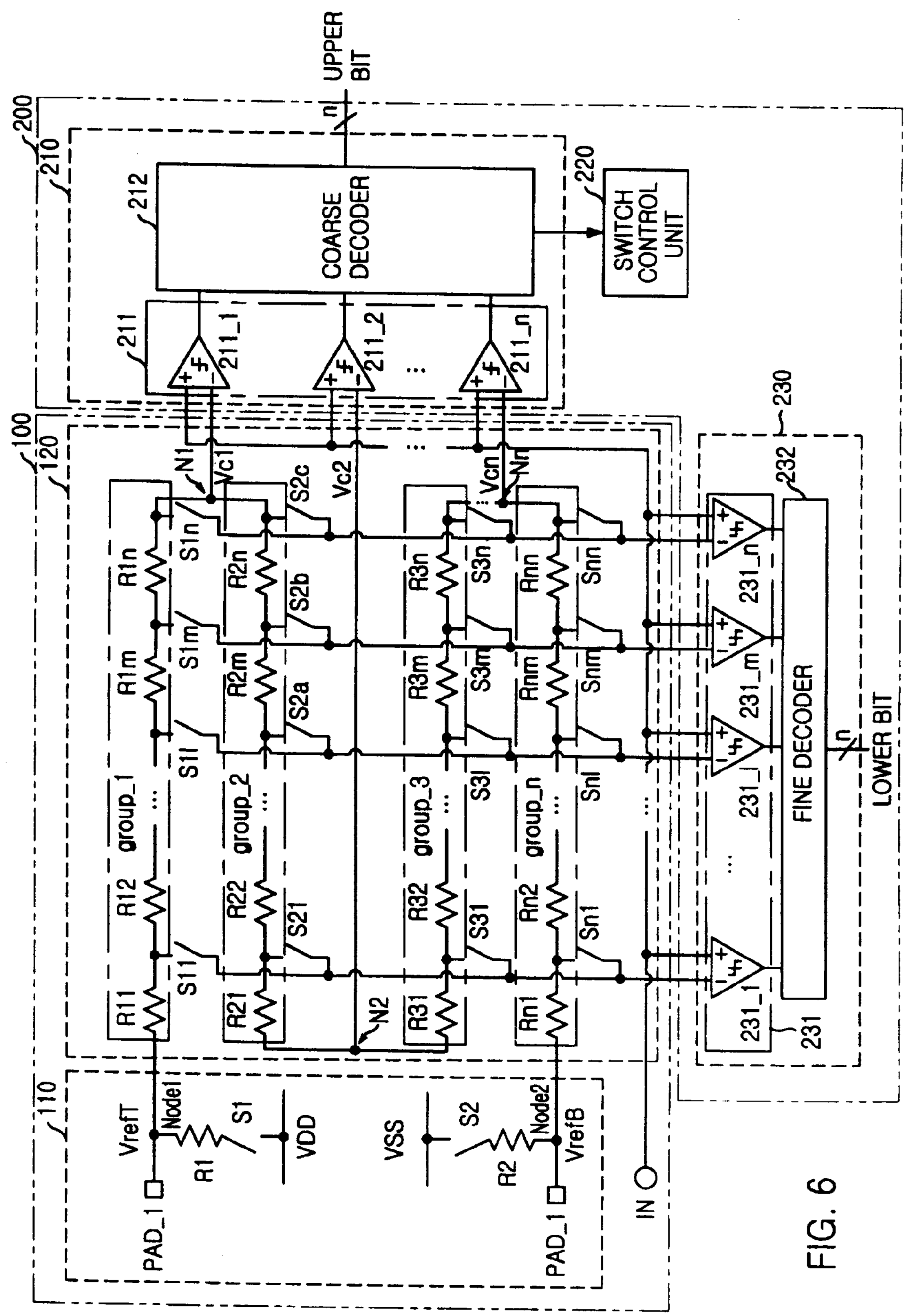
FIG. 6 is an exemplary circuit diagram of an analog-to-digital converter that may be used to carry out the system and technique shown in FIGS. 4 and 5.

FIG. 6 is an exemplary circuit diagram of an analog-to-digital converter that may be used to carry out the system and technique shown in FIGS. 4 and 5. As shown in FIG. 6, the analog-to-digital converter includes a gamma correction unit 100 and a decoding unit 200. The gamma correction unit

100 generates a plurality of corrected voltages according to the gamma function. The decoding unit 200 performs an analog-to-digital conversion of at least one voltage selected from the plurality of corrected voltages generated in the gamma correction unit 100 in response to an input signal IN. More specifically, the gamma correction unit 100 includes a reference voltage supply unit 110 and a correction voltage generating unit 120. The reference voltage supply unit 110 outputs reference voltages VrefT and VrefB and the correction voltage generating unit 120 divides the reference voltages VrefT and VrefB into a plurality of corrected voltages by the gamma function.

The reference voltage supply unit 110 includes voltage input pads PAD__1 and PAD__2, a first switch S1, a second switch S2, a first resistance R1 and a second resistance R2. The voltage input pads PAD__1 and PAD__2 receive reference respective voltages VrefT and VrefB. The first resistance R1 is connected to the first pad PAD__1. The first switch S1 is connected to the first resistance R1 and power supply voltage VDD). The second resistance R2 is connected to the second pad PAD__2 and the second switch S2 is connected to the second resistance R2 and ground. The reference voltage VrefT or the power supply voltage VDD is output from a first node N1 by selection of the first switch S1 and the reference voltage VrefB or ground VSS is output from a second node N2 by selection of the second switch S2.

The correction voltage generating unit 120 includes N numbers of resistance groups group__1 to group__n divided between the reference voltages VrefT and VrefB, a plurality of resistance arrays R11 to Rnn and a plurality of switches S11 to Snn. The plurality of resistance arrays R11 to Rnn output a plurality of gamma corrected voltages into a plurality of nodes N1 to Nn, which are the plurality of resistance groups are joined with each neighboring resistance group, and the plurality of switches S11 to Snn select at least one correction voltage from the plurality of the gamma corrected voltages.

The decoding unit 200 includes a coarse decoding unit 212, a switch control unit 220 and a fine decoding unit 230. The coarse decoding unit 210 selects and outputs one voltage among voltages of nodes N1 to Nn output from the plurality of resistance groups in response to the input signal IN and decodes the selected voltage. The switch control unit 220 disconnects the corresponding node in response to voltage output from the coarse decoding unit 21 0. The fine decoding unit decodes correction voltage divided by the resistance array selected from the N numbers of resistance groups group__1 to group__n by the switch control unit 220.

The coarse decoding unit 210 includes a first comparison unit 211 and a coarse decoder 212. The first comparison unit 211 receives voltage Vc1 to Vcn output from the plurality nodes N1 to Nn and compares the voltage Vc1 to Vcn with the input signal IN. The coarse decoder 212 detects and outputs the level of the input signal IN in response to an output of the first comparison unit 211.

The first comparison unit 211 includes N numbers of comparators 211__1 to 211__n. One input terminal of each comparator is connected to the plurality of nodes N1 to Nn and the input signal IN is applied to the other input terminal respectively.

The decoding unit 230 includes a second comparison unit 231 and fine decoder 232. The second comparison unit 231 compares a plurality of correction voltages divided through the resistance array R11 to Rnn that includes the resistance group selected by the switch control unit 220. The fine decoder 232 decodes the corresponding voltage in response to an output of the second comparison unit 231.

The second comparison unit 231 includes comparators, which are identical numbers to numbers of correction voltage divided through the resistance array the N numbers of resistance groups group__1 to group__n. One correction voltage among divided voltages output from one resistance array of the resistance groups group__1 to group__n is applied into one input terminal of the comparator and the input signal IN is applied into the other input terminal of each comparator.

When the reference voltages VrefT and VrefB output from the reference voltage supplying unit 110 are applied into the correction voltage generating unit 120 including the plurality of resistances R11 to Rnn, the reference voltages VrefT and VrefB are increased or reduced by the plurality of resistance R11 to Rnn and a plurality of divided voltages are generated in the plurality of nodes N1 to Nn, which the plurality of resistances are connected. At this time, the plurality of resistances are divided into N numbers of resistance groups group__1 to group__n, respectively, and each resistance group has a different resistance value.

For example, the resistances R11 to R1n included in the resistance group group__1 have the same resistance value. However, the other resistance group group__2 has a different a resistance value from the resistance group group__1. Also, the resistances R21 to R2n included in the resistance group group__2 have the same resistance value.

Because each resistance group has a different resistance value, voltage difference for each nodes N1 to Nn, which each resistance group is joined, is increased. The voltage difference is adjusted to be similar to the gamma function. Namely, the correction voltage generating unit 120 divides voltages of the reference voltage supply unit 110 and generates correction voltage corresponding to the gamma function.

If the reference voltages VrefT and VrefB output from the reference voltage supply unit 110 do not have to be exact voltage, the reference voltages VrefT and VrefB are not applied into the voltage input pads PAD__1 and PAD__2, but the power supply voltage VDD and ground voltage VSS can be applied.

The input signal IN applied to the decoding unit 200 is applied into positive input terminals of comparators 211__1 to 211__n and 231__1 to 231__n in the first and second comparison units 211 and 231. The node voltages Vc1 to Vcn generated from the correction voltage generating unit 120 are applied into negative input terminals of comparators 221__1 to 211__n in the first comparison unit 211 and are compared with the input signal IN.

The level of the input signal IN is determined through comparison between the input signal IN and the node voltages Vc1 to Vcn and the determined level is output into the switch control unit 220 and then decoded into digital signals. At this time, because all the switches are open, the comparators 231__1 to 231__n in the fine decoding unit 230 are not operated.

The switch control unit 220 closes the switches connected to the corresponding resistance group according to the level of the input signal IN applied from the coarse decoding unit 210.

When the level of the input signal IN is determined in the comparator 211__1, the switches S11 to S1n connected to the resistance group group__1 corresponding to the comparator 211__1 are shorted or closed so that all of voltages divided by the resistance group group__1 are transferred into the fine decoding unit 230. The comparators 231__1 to 231__n in the fine decoding unit 230 detect, more finely, a level of the input signal IN in response to the correction voltage divided from the resistance group group__1.

The coarse decoding unit 210 roughly detects the level of the input signal IN and the fine decoding unit 230 detects a fine level of the input signal IN. Namely, the coarse decoding unit 210 outputs upper bits of the data decoding the input signal IN and the fine decoding unit 230 outputs lower bits thereof.

When the reference voltage supply unit 110 illustrated in FIG. 6 is applied in an integrated circuit, there are advantages to reduce a circuit area and power consumption. However, because the fixed reference voltages VrefT and VrefB are supplied into the correction voltage generating unit 120, the correction voltage generating unit 120 generates the gamma function by only dividing two reference voltages VrefT and VrefB so that the gamma function is fixed.

Figure 7:
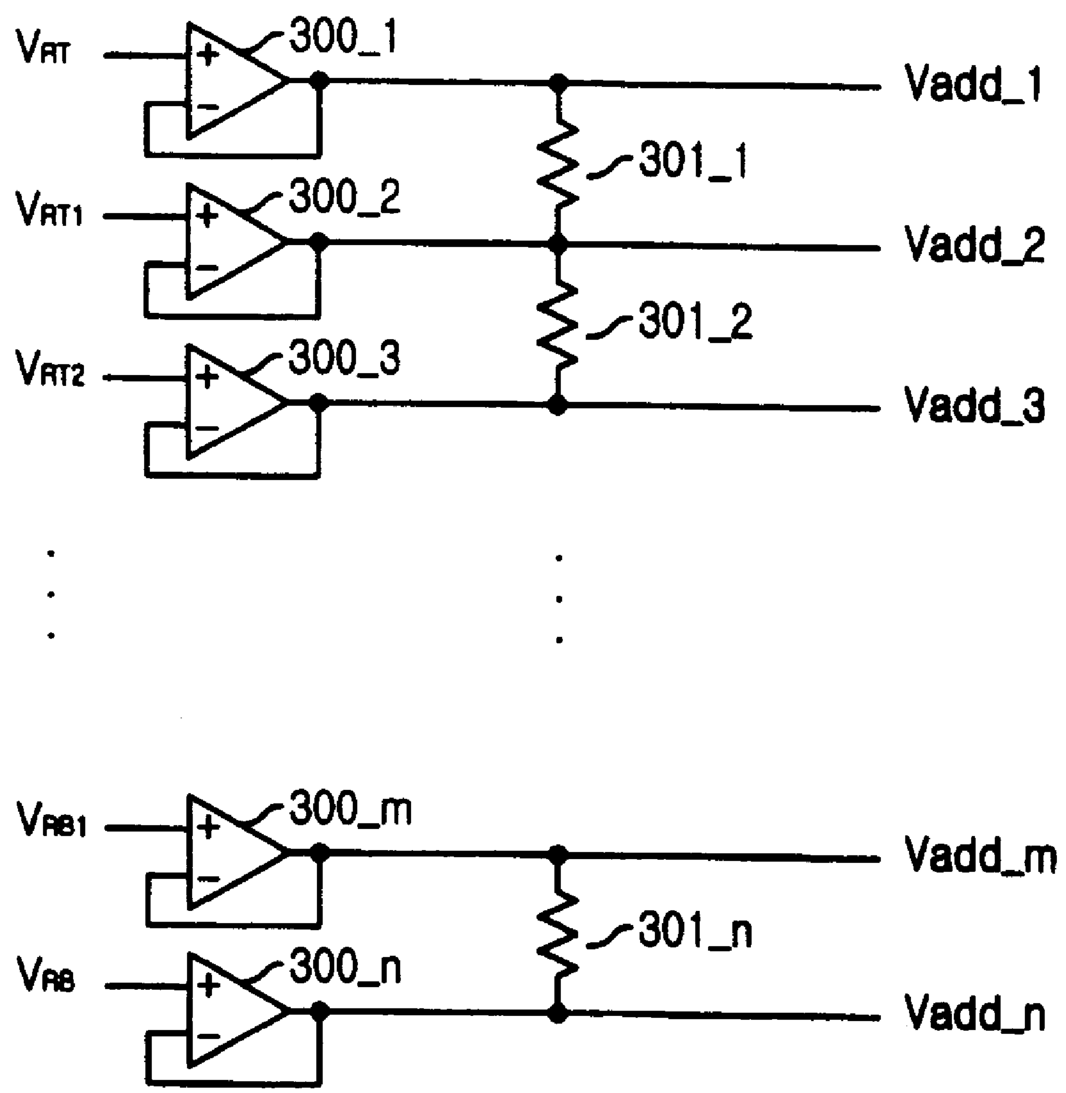
FIG. 7 is an exemplary circuit diagram of a voltage supply device that may be used to supply a variable reference voltage to the analog-to-digital converter shown in FIG. 6.

FIG. 7 is an exemplary circuit diagram of a voltage supply device, that may be used to supply a plurality of reference voltages to the analog-to-digital converter shown in FIG. 6. As shown in FIG. 7, the voltage supply device includes a plurality of operational amplifiers 300_1 to 300_n and a plurality of resistances 301_1 to 301_n. The plurality of operational amplifiers receive and buffer the plurality of reference voltages VRT to VRB and the plurality of resistances connect each output terminal of the operational amplifiers 300_1 to 300_n with each neighboring output terminal thereof. For example, the resistance 301_1 connects an output terminal Vadd_1 of the operational amplifier 300_1 with an output terminal Vadd_2 of the operational amplifier 300_2. Also, the plurality of resistances 301_1 to 301_n have the same resistance value.

Referring to FIG. 7, the voltage supply device may be used as the reference voltage supply unit 110 illustrated in FIG. 6. The voltage Vadd_2 to Vadd_m are selectively applied to the nodes N1 to Nn of the correction voltage generating unit 120 except the voltage Vadd_1 and Vadd_n applied to the resistances R11 and Rn1, which are necessary voltages in order that the correction voltage generating unit 120 performs the gamma function, so that the gamma function can be desirably distorted.

While the present invention has been described with respect to the particular embodiments, it will be apparent to those skilled in the art that various changes and modifications may be made without departing from the spirit and scope of the invention as defined in the following claims

What is claimed is:

1. An analog-to-digital converter, comprising:
   - a gamma correction unit that generates a plurality of reference voltages corrected according to a gamma function, wherein the gamma correction unit includes:
     - a reference voltage supply unit that outputs first and second reference voltages; and
     - a correction voltage generating unit that divides the first and second reference voltages into a plurality of correction voltages according to a gamma function; and
   - a decoding unit that selects at least one corrected reference voltage in response to an input signal and performs analog-to-digital conversion of the selected reference voltage.

2. The analog-to-digital converter as recited in claim 1, the reference voltage supply unit includes:
   - a first voltage input pad to which first reference voltage is applied;
   - a second voltage input pad to which second reference voltage is applied;
   - a first resistance connected to the first input pad;
   - a first switch connected to the first resistance and power supply voltage, whereby the first reference voltage is determined;
   - a second resistance connected to the second input pad; and
   - a second switch connected to the second resistance and ground, whereby the second reference voltage is determined.

3. The analog-to-digital converter as recited in claim 1, wherein the correction voltage unit includes:
   - a resistance array, which is divided into a plurality of resistance groups between the first and second reference voltages, for outputting a plurality of correction voltages into a plurality of nodes to which each resistance group is joined with each neighboring resistance group; and
   - a plurality of switches that select and output at least one voltage from a plurality of correction voltages, which are divided by the resistance array.

4. The analog-to-digital converter as recited in claim 3, wherein the decoding unit includes:
   - a coarse decoding unit for selecting and decoding one voltage from the plurality of voltages of the nodes in response to the input signal;
   - a switch control unit for selecting the resistance group and shorting one of the plurality of switches in response to voltage output from the coarse decoding unit; and
   - a fine decoding unit for decoding a plurality of correction voltages divided by resistances of the resistance group selected by the switch control unit.

5. The analog-to-digital converter as recited in claim 4, wherein the coarse decoding unit includes:
   - a first comparison unit that receives and compares the voltages of the nodes, to which each resistance group is joined with each neighboring resistance group, and the input signal; and
   - a coarse decoder for detecting and decoding a level of the input signal in response to an output of the first comparison unit.

6. The analog-to-digital converter as recited in claim 4, wherein the fine decoding unit includes:
   - a second comparison unit that receives and decodes a plurality of correction voltages divided by resistances of the resistance group selected by the switch control unit and the input signal; and
   - a fine decoder for detecting and decoding a level of the input signal in response to an output of the second comparison unit.

7. The analog-to-digital converter as recited in claim 5, wherein the first comparison unit includes a plurality of comparators.

8. The analog-to-digital converter as recited in claim 6, wherein the second comparison unit includes comparators which are identical numbers with the numbers of correction voltages divided by resistances of the resistance group selected by the switch control unit.

9. An analog-to-digital converter comprising:
   - a gamma correction unit that generates a plurality of reference voltages corrected according to a gamma function, wherein the gamma correction unit includes:
     - a correction voltage generating unit that generates a plurality of correction voltages; and
     - a voltage supply unit that buffers a plurality of reference voltages and outputs the highest and the lowest voltages and at least one voltage selected from the plurality of reference voltages; and
   - a decoding unit that selects at least one corrected reference voltage in response to an input signal and performing analog-to-digital conversion of the selected reference voltage.

* * * * *